United States Patent [19]
Keate et al.

[11] Patent Number: 5,835,165
[45] Date of Patent: Nov. 10, 1998

[54] REDUCTION OF FALSE LOCKING CODE WORDS IN CONCATENATED DECODERS

[75] Inventors: Christopher Keate, Santa Clara; Nadav Ben-Efraim, Sunnyvale, both of Calif.

[73] Assignee: LSI Logic Corporation, Milpitas, Calif.

[21] Appl. No.: 476,434

[22] Filed: Jun. 7, 1995

[51] Int. Cl.[6] ................................ H04N 7/64
[52] U.S. Cl. .............. 348/845.1; 371/42; 375/341; 348/518
[58] Field of Search .................... 348/390, 426, 348/518, 500, 466; 371/35, 42, 47.1; 375/341, 354, 356, 346

[56] References Cited

U.S. PATENT DOCUMENTS

| | | | |
|---|---|---|---|
| 4,694,291 | 9/1987 | Denhez | 375/341 |
| 5,420,640 | 5/1995 | Munich | 371/42 |
| 5,422,894 | 6/1995 | Abe et al. | 371/42 |
| 5,519,734 | 5/1996 | Ben-Efraim | 375/341 |

*Primary Examiner*—Victor R. Kostak
*Attorney, Agent, or Firm*—Conley, Rose & Tayon; B. Noel Kivlin

[57] ABSTRACT

A concatenated three layer Viterbi, Reed-Solomon/Deinterleaver and Descrambler forward error correction decoder may be utilized in digital video and audio systems, and for direct broadcast satellite applications. The digital signal may be a compressed video and audio signal transmitted from a direct broadcast satellite. Acquisition for three layers of synchronization are required, but once all three layers are in-sync, down stream data synchronization monitoring will suffice so that upstream synchronization monitoring can be disabled thus improving system robustness to noise bursts and false synchronization on false sync bytes generated at the transmission encoder during non-changing data signal conditions.

23 Claims, 8 Drawing Sheets

Pa: STATE TRANSITION, SYNC WORD DETECTED (N,M,K)
Qa: STATE TRANSITION, SYNC WORD MISDETECTED

Pt: STATE TRANSITION, SYNC WORD DETECTED (N,M,L)
Qt: STATE TRANSITION, SYNC WORD NOT DETECTED

Pa: STATE TRANSITION, INVERTED SYNC WORD DETECTED (8*N,M,K)
Qa: STATE TRANSITION, INVERTED SYNC WORD MISDETECTED

REDUCTION OF FALSE LOCKING CODE WORDS IN CONCATENATED DECODERS

CROSS REFERENCE TO RELATED PATENT APPLICATIONS

This patent application is related to a U.S. Patent Application filed concurrently herewith, and which is entitled "OPTIMIZATION OF SYNCHRONIZATION CONTROL IN CONCATENATED DECODERS" by Daniel Luthi and Nadav Ben-Efraim, and incorporated by reference herein.

BACKGROUND OF THE INVENTION

1. Field of the Invention

The present invention relates to synchronization of digital signals in a forward error correction concatenated decoder and, more particularly, to a method and apparatus for feeding back a signal indicating synchronization of the digital signals in a downstream decoder while disabling the synchronization detection of an upstream decoder, thereby improving overall signal synchronization performance of the concatenated decoder under bursty or colored noise conditions.

2. Description of the Related Technology

Digital transmission of video, audio and data information is becoming more and more prevalent. The advent of low cost and sophisticated microprocessors for both data manipulation and signal processing has lowered the cost and increased the sophistication when processing digital information. The promise of a cornucopia of multimedia services through cable, local area spread spectrum, digital cellular telephone, direct broadcast satellite, high definition television and teleconferencing require methods of information transmission that maintain a high degree of integrity while minimizing signal bandwidth and signal transmission power requirements.

Heretofore, the use of analog techniques for transmission of television, radio, and other types of communications resulted in minimal bandwidth and power requirements for the information conveyed. With the advent of the wide spread use of digital data compression and error correction technologies, transmission of digital signals is rapidly becoming the preferred mode of operation in the field of communications for all forms of information transmission.

A particularly advantageous application for the use of digital transmission of information is in satellite communication systems such as, for example, direct broadcast satellite ("DBS") communication systems for transmitting television, video and audio, directly to the viewing public. New video and audio standards are emerging for the transmission of digital signals, for example, the Moving Pictures Experts Group (MPEG).

Digital signals, however, require greater signal bandwidth than equivalent analog signals. Increased bandwidth requirements of a digital signal creates a problem when utilizing existing communication channels having limited bandwidth such as, for example, telephone circuits and television broadcast channels.

The solution to the increased bandwidth requirements of a digital signal is to utilize digital data compression which effectively removes unnecessary or redundant information from the digital signal. Thus, only absolutely essential information need be sent over a restricted bandwidth communications channel. Compression of the information in a digital signal may effectively reduce the signal bandwidth requirements to less than what is required for an equivalent analog signal. A drawback, however, in only sending essential information in a digital signal is that any errors caused during the transmission of the digital signal materially effect the quality of the information. Thus, digital data compression requires an extremely low transmission error rate.

When compressing a digital signal such as a digital video signal, forward error correction ("FEC") techniques have been successfully utilized to minimize data errors. As an example, acceptable digital video signal transmission requires an extremely low bit-error rate ("BER") in the area of $1e^{-12}$. Conventional FEC techniques require high transmitter power and an excessive amount of redundant data overhead to achieve these low BERs. The concatenation of just two well known FEC techniques (i.e., Reed-Solomon and Viterbi), reduces the power and bandwidth that would be required by a single FEC code to obtain the same low error rate.

FIG. 1 illustrates a basic interleaved concatenated FEC technique in a digital data coding and decoding transmission system ("codec"). The first code or outer-code is typically a Reed-Solomon (non-binary code) and the inner code (binary code) may be either a convolutional or Hamming code. Digital information 100 is first encoded by an outer non-binary encoder 102. The non-binary encoded output 104 of encoder 102 is then interleaved to a depth B in an interleaver 120. The interleaved output 122 is further encoded by an inner binary encoder 106. The output of the encoder 106 may be transmitted over a communications channel 108 by modulation means well known to those skilled in the art of digital communications.

At the receiving end of the communications channel 108, an inner binary decoder 110 decodes, for example, the Viterbi or Hamming code. The output 112 of the inner binary decoder 110 is deinterleaved by deinterleaver 126. The deinterleaver 124 output 126 is further decoded by an outer non-binary decoder 114. The outer non-binary decoder 114, for example, decodes the Reed-Solomon code. The data on the outer non-binary decoder 114 output 116 is substantially the same as the original digital information 100. Digital information may be compressed before applying it at the data input 100 in order to reduce the communications channel 108 bandwidth requirements. In this case, compressed data at the output 116 is then decompressed to represent the original digital information 100.

Convolutional coding of digital data is well known in the art and is widely used for forward error correction ("FEC") in digital communication systems. A convolutional code maps a number n of information bits into a number m, where m>n, of single-bit "codewords" to be transmitted over a communications channel. The ratio n/m is referred to as the code rate. As an example, a commonly used convolutional code transforms each information bit to two codewords prior to transmission. This is a code rate of ½. The rate of the code determines the necessary communications channel bandwidth. The bandwidth required may be defined as the reciprocal of the code rate. For instance a code rate=½ would double the bandwidth or data rate in the transmission channel. If two individual codes are used the overall rate is just the product of the two codes.

A technique called "punctured coding" may be utilized to increase the bandwidth efficiency of the communication system when compared to a code rate of ½. Punctured coding techniques allow a lower rate encoder/decoder (e.g., rate=½) to be used to generate a higher rate coding function, e.g., ¾. In punctured coding, some of the data symbols from an encoder having a rate ½ encoded data stream are "punctured" or deleted and not transmitted.

One of the performance criteria for measuring the effectiveness of an error correction technique is the signal-to-noise ratio ("SNR") that is required in the channel to obtain the necessary BER at the output of the outer decoder. A low SNR corresponds to a low power requirement for the transmitter (hence lower cost). The most desirable error correction codes have a high data rate and a low SNR requirement for a given error rate.

Table 1 illustrates the theoretical performance of three different rate ¾ codes. The values are dependent on the BER operating range. For this error-rate, the composite code has almost a 3 dB advantage over the best single FEC code.

TABLE 1

| Code | Eb/No db |
|---|---|
| Rate ¾ Viterbi | 10.8 |
| Reed-Solomon | 8.5 |
| Rate ⅞ Viterbi, Deinterleaver and (208, 188) Reed-Solomon | 5.6 |

Concatenated FEC has lower transmission power requirements for a given BER. This results in significantly lower costs for DBS video systems by reducing the transmission power required for a given BER. Thus, the manufacture of more cost effective satellite transmitters and ground station receivers are possible.

The purpose of interleaving and deinterleaving is to create randomly distributed errors from "burst errors" that occur from the Viterbi decoder. The interleaver writes data bytes into columns or frames vertically and then allows the bytes to be read out horizontally from memory before they enter the Viterbi encoder. In this manner adjacent bytes from the Reed-Solomon encoder are separated by the depth of the interleaver in terms of bytes.

Referring now to FIG. 2, a schematic block diagram of a Viterbi-Reed-Solomon concatenated decoder is illustrated. The process of transmission and reception introduces timing and polarity uncertainties in the data stream. These uncertainties must be removed from the data for proper FEC decoding to occur. In the concatenated decoder system illustrated in FIG. 2, the Viterbi output BER is monitored to determine if the phase and symbol timing of the Viterbi are correct. By trial and error, the Viterbi timing and phase inputs (QPSK modulation) are varied until the Viterbi synchronization circuit detects proper signal alignment.

Once the Viterbi is synchronized, the Reed-Solomon synchronization circuit searches for a synchronization pattern in the output of the Viterbi decoder. When the synchronization word is found, the Reed-Solomon synchronization circuit properly aligns the Deinterleaver, the Reed-Solomon decoder, and the Descrambler. The Reed-Solomon synchronization circuit also removes a possible 180 degree phase shift ambiguity that may not be detected by the Viterbi decoder.

A system for concatenated decoding is more fully described in commonly owned co-pending U.S. patent application Ser. No. 08/289,891, entitled "Concatenated Decoding Method and Apparatus" by Keate, et al., filed Aug. 12, 1994, and incorporated by reference herein for all purposes.

The concatenated decoder illustrated in FIG. 2 utilizes three independent layers of synchronization: 1) Viterbi, 2) Deinterleaver and Reed-Solomon, and 3) Descrambler. Global control logic generates control signals for the Viterbi, Descrambler, Deinterleaver and Reed-Solomon decoders.

The Viterbi synchronizer uses output statistics of the Viterbi decoder to identify signal synchronization. This is accomplished by observing the valid data symbols and the bit errors in the decoded data stream. The Viterbi synchronizer does not inspect the data stream for specific synchronization patterns nor does it remove any portions of the data stream. Once the Viterbi decoder reaches synchronization, however, the Deinterleaver and Reed-Solomon decoder require their own synchronization procedures.

The Deinterleaver and Reed-Solomon synchronizer identifies a sync word in the output of the Viterbi decoder for synchronization of the Deinterleaver and Reed-Solomon decoders. In addition, the Deinterleaver and Reed-Solomon synchronizer resolves a possible 180 degrees phase uncertainty that may have been introduced by the demodulator and not detectable in the Viterbi stages. Any phase uncertainty of the signals to the Viterbi decoder is resolved by the Deinterleaver and Reed-Solomon synchronizer during acquisition of synchronization by simultaneously monitoring both the sync word and its complement. The sync word need not be removed from the data stream since it is an integral part of an MPEG system layer syntax and therefore must be left undisturbed by operation of the channel decoder.

In the third level, the Descrambler synchronizer identifies an inverted synchronization word to determine whether there is synchronization for the Descrambler. The Descrambler is restarted every 8*N byte times. This restart is aligned with the complemented synchronization word that is present in the data stream once every eight Reed-Solomon code words (once every 8*N bytes). More detailed operational information for a typical decoder is illustrated in LSI LOGIC CORPORATION "L64709 Forward Error Correction Concatenated Decoder Technical Manual" 1995, attached hereto as Appendix A and incorporated by reference herein.

Each of the synchronization layers mentioned above rely on a different criteria for detecting synchronization. The first layer, Viterbi, synchronization is susceptible to long bursts of noise which may cause the Viterbi synchronization stage to loose sync. The loss of the Viterbi sync due to a long noise burst would then propagate sync loss through the subsequent two layers, resulting in the necessity to reacquire synchronization throughout all three layers.

The second layer (Deinterleaver and Reed-Solomon) synchronization is more stable than the BER monitoring mechanism of the first layer (Viterbi) synchronization when used in a bursty noise environment. The second layer synchronization merely looks for sync code words and when finding same, locks onto the code words and subsequent data words. When no data is being sent (long stream of zeros), however, the transmission scrambler generates duplicates of the second layer sync word, for example, 47 Hex. In operation, this increases the probability at the receiving end for the second layer sync stage to false lock, and thus increases the time that the second layer sync stage may be in false lock.

The third layer (Descrambler) synchronization would not be confused by improper creation of duplicates of the original second layer sync word patterns because the correct placement of inverted sync bytes would not occur. Thus, synchronization of the third layer would indicate correct sync alignment of all three layers, but false alignment of the second layer would not produce a correct sequence of inverted bytes every eight words (8*N bytes).

What is needed is a method and apparatus which reduces the possibility of false sync locking during periods of no data that generate duplicates of the second layer sync words that may cause the second layer sync stage to false lock but not the third layer sync stage.

SUMMARY OF THE INVENTION

It is therefore an object of the present invention to reduce the possibility of false locking on duplicates of a second layer sync word which may be generated by an encoder during coding of non-changing data. This may cause the second layer sync stage to false lock on erroneous data, but will not affect synchronization in the third layer sync stage.

Another object is to decrease the time that the second layer sync stage can be in false lock, this improves the robustness and behavior of the decoding system synchronization under no data conditions, even during the third layer encoder generating duplicates of the second layer sync word.

In an embodiment of the present invention the status of the third layer Descrambler synchronization is monitored, and when the third layer Descrambler is in sync, the second layer Reed-Solomon synchronization monitoring is disabled. A digitized blank picture or channel which is not in use, may result in a long string of non-changing data. After scrambling, such non-changing data will be transformed by the Scrambler, and may contain erroneous duplicates of the sync byte. It is these erroneous sync byte duplicates that may cause the second layer synchronization to false lock to data stream positions other than the correct one. Even though the Scrambler may generate erroneous duplicates of the original sync pattern, it will not at the same time correctly generate inverted sync bytes needed by the third layer synchronization (every 8*N bytes). Therefore, once third layer synchronization is obtained, monitoring of the second layer synchronization is no longer needed. Thus, false locking of the second layer sync may be effectively prevented whenever the third layer is in sync.

A feature of the present invention is to disable monitoring of the second layer synchronization whenever the third layer is in sync.

Another feature of the present invention is determining when the second layer synchronization is in false lock by observing whether the third layer is in sync.

An advantage of the present invention is determining when the second layer synchronization is false locked on an erroneous data stream.

Other and further objects, features and advantages will be apparent from the following description from the presently preferred embodiment of the invention, given for the purpose of disclosure and taken in conjunction with the accompanying drawings.

DETAILED DESCRIPTION OF PREFERRED EMBODIMENTS

Figure 2:
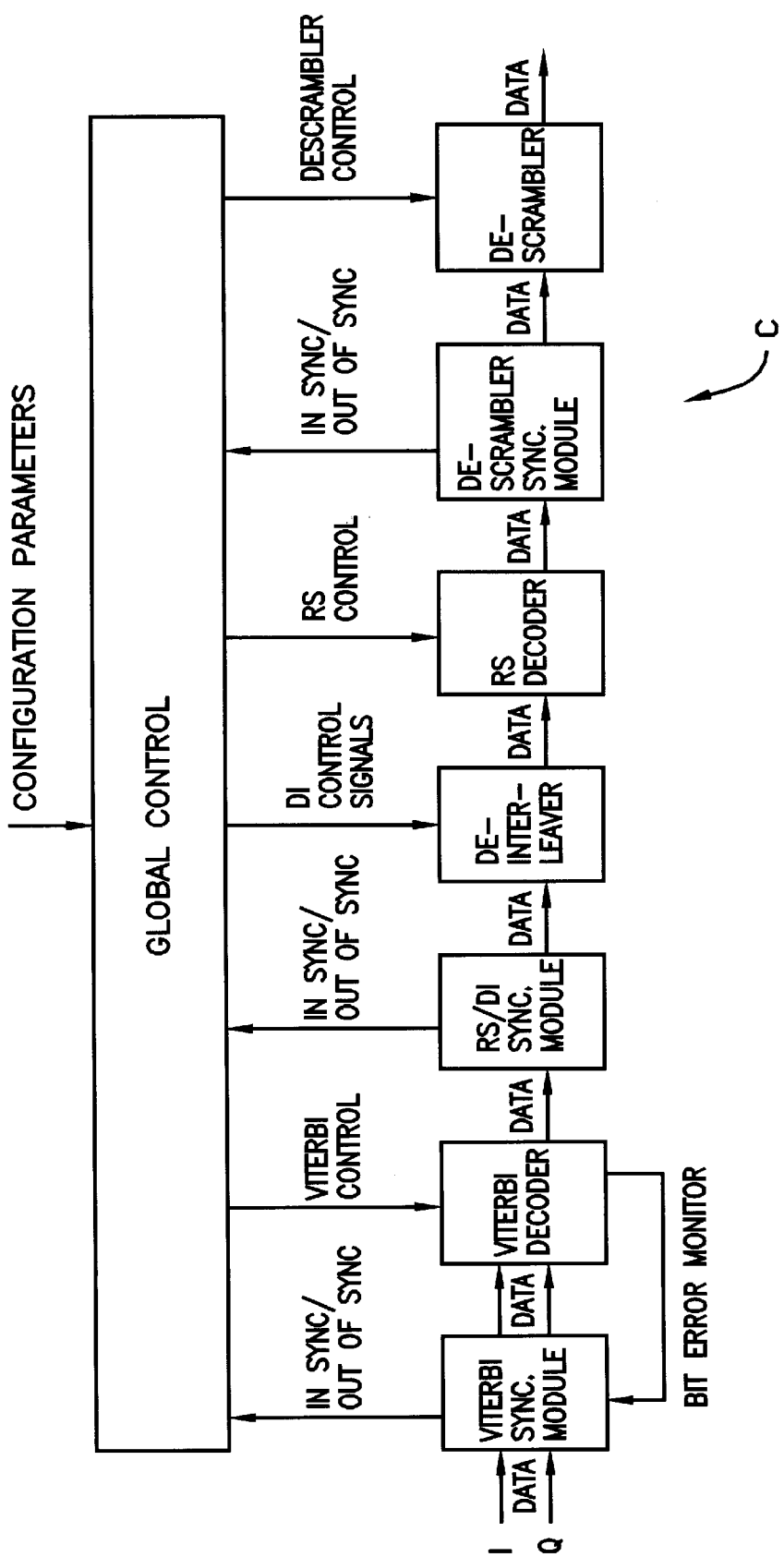
FIG. 2 illustrates a functional block diagram of a concatenated decoder.

Referring now to the drawings, the details of a preferred embodiment of the invention is schematically illustrated. Like elements are numbered the same, and similar elements are represented by the same number and a different lower case letter suffix. Referring now to FIG. 2, a schematic block diagram of a system for decoding a composite Viterbi and Reed-Solomon forward error correction code is illustrated. This FEC decoder or "Codec" is generally represented by the letter C.

The Codec C comprises a Viterbi Sync Module, a Viterbi Decoder, a Reed-Solomon/Deinterleaver Sync Module, a Deinterleaver, a Reed-Solomon Decoder, a Descrambler Sync Module, a Descrambler, and a Global Control. A more detailed description of the Codec C may be obtained by reference to LSI LOGIC CORPORATION "L64709 Forward Error Correction Concatenated Decoder Technical Manual" 1995, attached hereto as Appendix A, and commonly owned co-pending U.S. patent application Ser. No. 08/289,891, entitled "Concatenated Decoding Method and Apparatus" by Keate, et al., filed August 12, both incorporated by reference herein.

Many digital communication systems require periodic structures or Frames to allow operation of block error correcting codes. In the Codec C, a Frame is defined as the syncword plus random FEC encoded data. The purpose of the syncword is to align the system for proper decoding by the error correction decoding devices.

The synchronization process aligns the Viterbi Decoder, Deinterleaver and Reed-Solomon Decoder, and Descrambler at the proper place in the data stream to start decoding. By comparing the data with a known sequence, i.e. correlation, the synchronization circuitry can determine after several frame comparisons where the frame boundary exits. The Global Control conveys timing and control information to the appropriate function blocks of the Codec C.

Viterbi Decoder Synchronization

Figure 3:
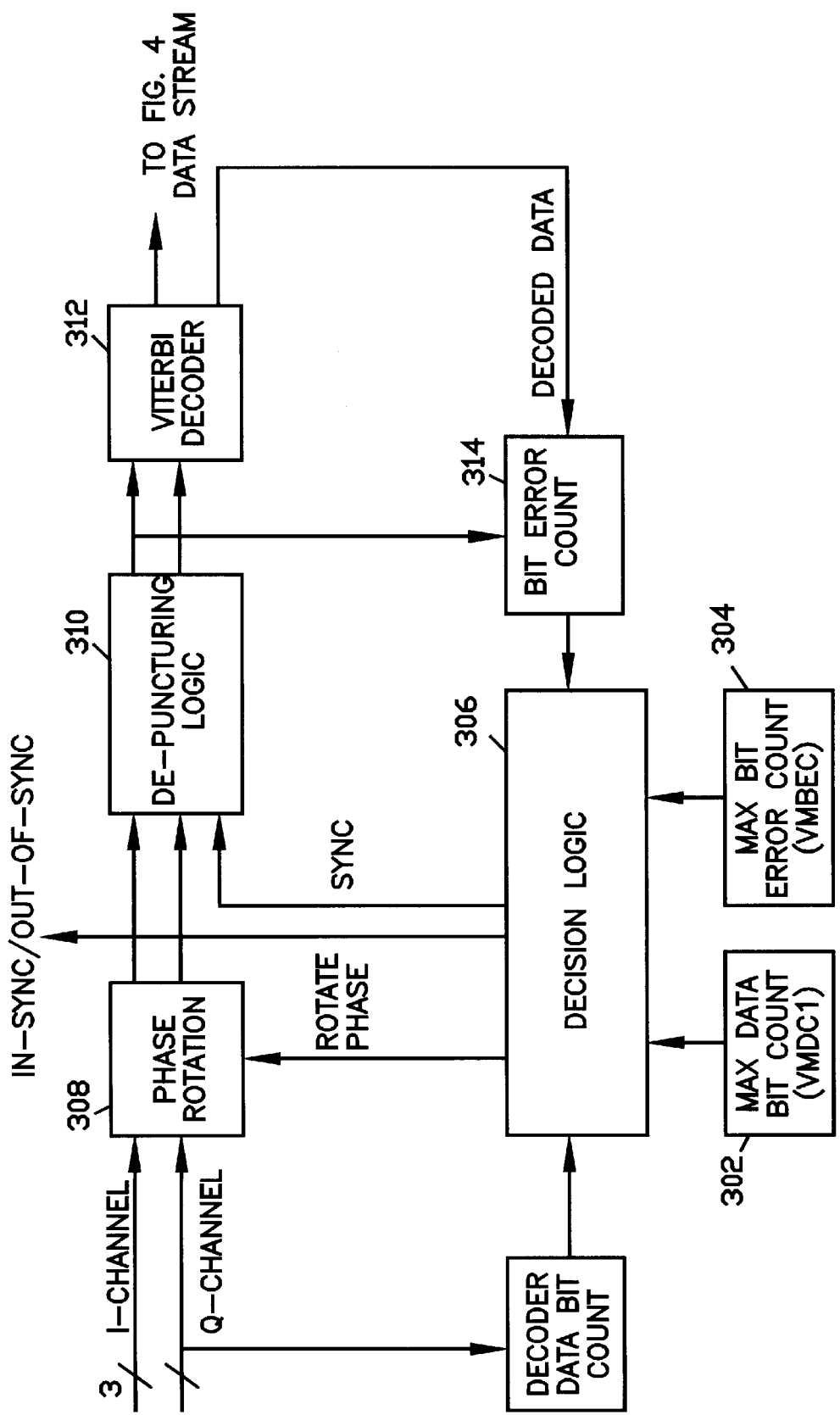
FIG. 3 illustrates a more detailed schematic block diagram of the Viterbi Decoder Sync Module of FIG. 2.

Referring now to FIG. 3, a schematic block diagram of the Viterbi Decoder Sync Module is illustrated. The Viterbi Decoder Sync Module determines whether the Viterbi Decoder 312 is synchronized by observing the valid data symbols and the bit errors in the decoded data stream, determined by the Bit Error Count 314. The Max Data Bit Count configuration register 302 sets the number of valid data bits at the output of the Viterbi Decoder 312 over which the number of channel symbol errors are to be counted. During that interval, whenever the bit error count is above a value specified in the Max Bit Error Count register 304, the Synchronization Decision Logic 306 determines whether an out-of-phase signal condition exists. If an out-of-phase condition exits, the Decision Logic 306 will either adjust the phase of the received I and Q channels in the Phase Rotation logic 308 or the data stream alignment in the De-Puncturing logic 310 by successively stepping through as many different combinations as is required to achieve proper synchronization.

There is a possibility of both I and Q channels appearing inverted and swapped. There are a multitude of possible phases choices that may be selected in the Phase Rotation logic 308. In the case of a misaligned data stream, the resulting bit error rate at the output of the Viterbi Decoder 312 compared to the original message is about 0.5. Thus, there is a strong correlation between an out-of-sync condition and the observed bit error rate.

The first Viterbi synchronization stage does not inspect the data stream for specific synchronization patterns nor does it remove any portion of the incoming data stream. Once the Viterbi Decoder has synchronized to the incoming data stream, the De-Interleaver and Reed-Solomon Decoder require their own synchronization procedure.

Reed-Solomon and De-Interleaver Synchronization

Figure 4:
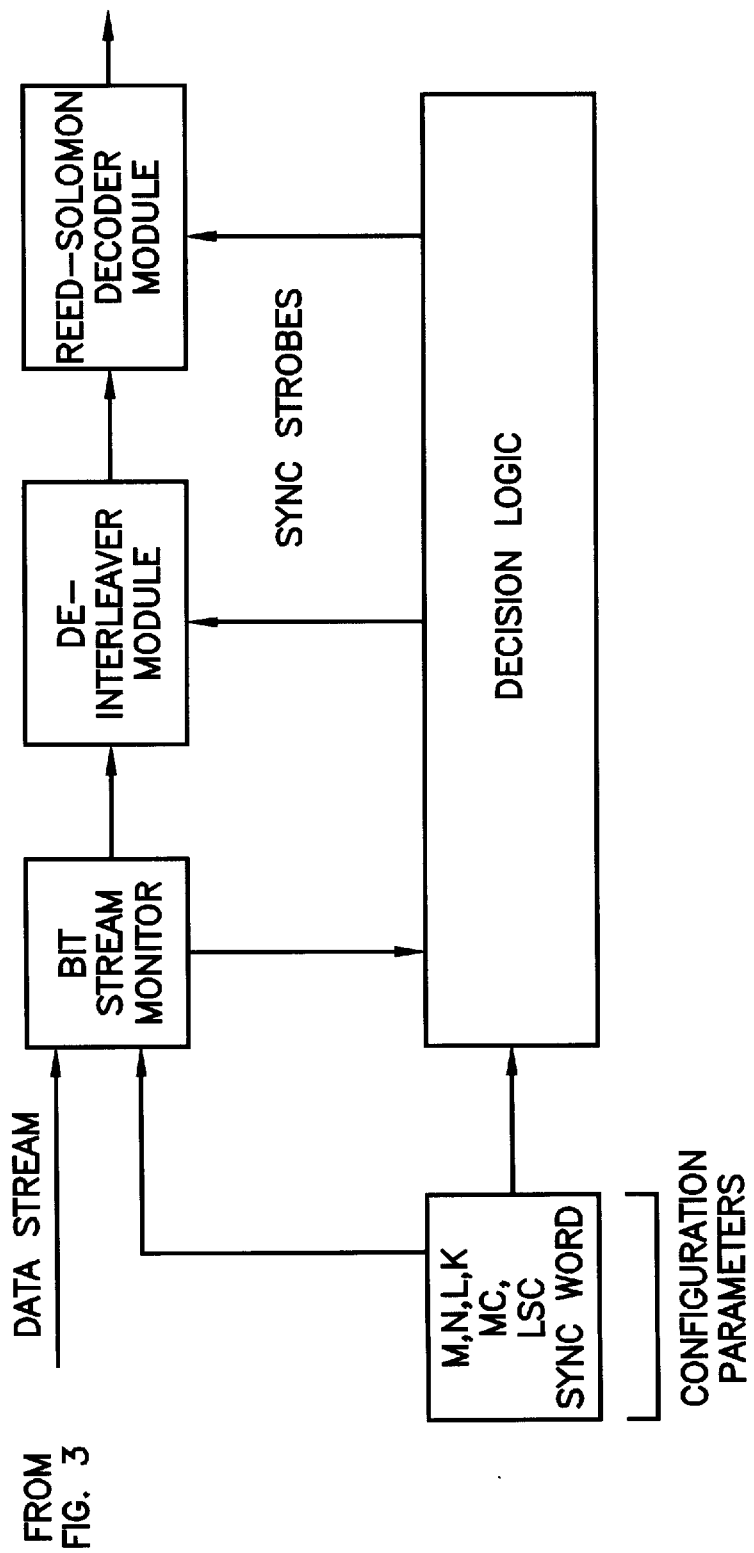
FIG. 4 illustrates a more detailed schematic block diagram of the Reed-Solomon and Deinterleaver synchronization and decoder of FIG. 2.

The Reed-Solomon and Deinterleaver synchronization searches the data stream for a pre-defined sync word as the basis for determining whether there is an in-sync or out-of-sync condition. FIG. 4 illustrates a schematic block diagram of the Reed-Solomon and Deinterleaver synchronization and decoder. Configuration parameters are defined as follows:

N: Length of the RS codeword in Bytes

M: Length of synchronization word in bits

K: Maximum Number of mismatching bits allowed to declare a match when comparing M bits in the data stream to the reference sync word during acquisition phase.

MC: Match counter, number of sync word matches found so far during acquisition phase.

L: Maximum Number of mismatching bits allowed to declare a match when comparing M bits in the data stream to the reference sync word during tracking phase.

MSC: Mismatch counter, number of sync word mismatches found so far during tracking phase.

Figure 5A:
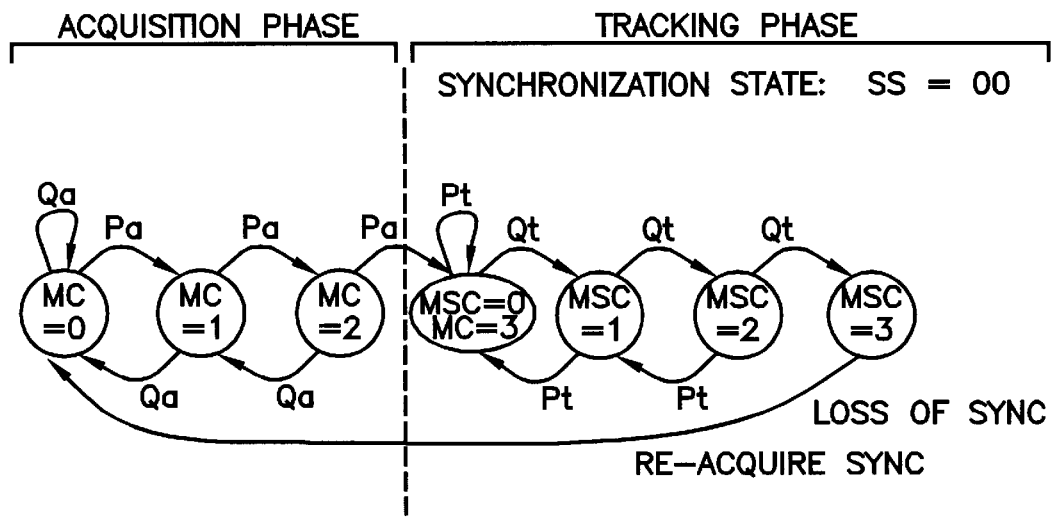
FIGS. 5A–5C illustrate state diagrams of the system of FIG. 4.
Figure 5B:
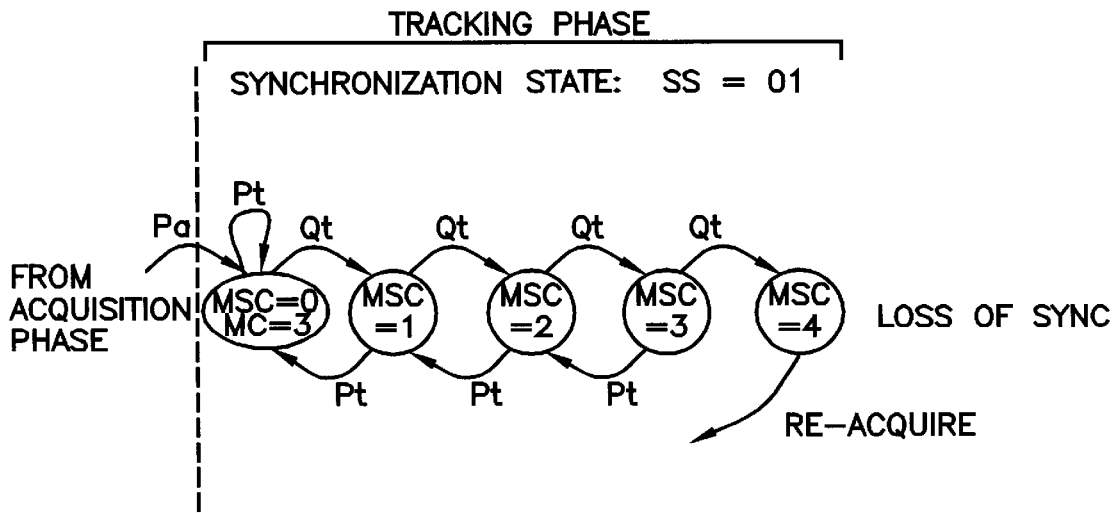
Figure 5C:
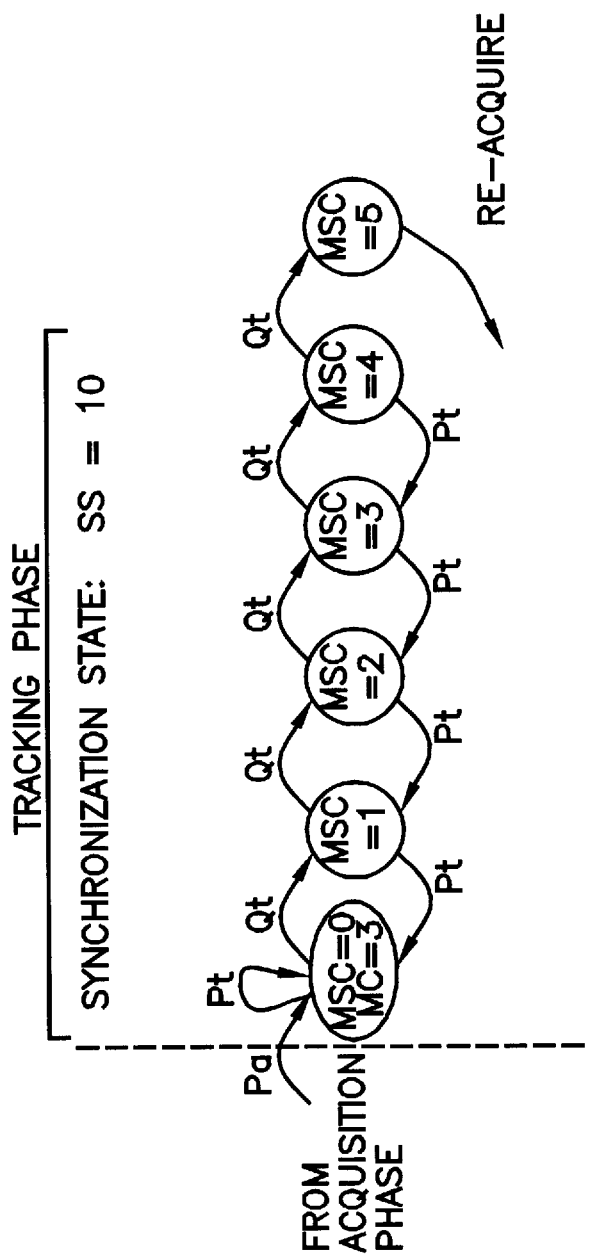

Referring to FIGS. 5A–5C, state diagrams of the system of FIG. 4 are illustrated. The state diagrams of FIGS. 5A–5C outline the mechanisms in determining synchronization, tracking and loss of synchronization of the Reed-Solomon and Deinterleaver (second layer). The state diagram for the tracking phase may be configured to obtain different loss of sync detection. The Synchronization State parameter (SS) allows for three, four, or five misdetected sync words (FIGS. 5A, 5B or 5C, respectively) before a loss of synchronization is declared. The acquisition phase is identical in all three cases of FIGS. 5A–5C.

Of particular interest is the data format specified in the MPEG-2 system layer document (ISO/IEC 13818, Generic Coding of Moving Pictures and Associated Audio (MPEG-2), Draft International Standard. ISO/IEC Copyright Office, Case Postal 56, CH1211 Geneve 20, Switzerland). This data format calls for an MPEG-2 Reed-Solomon (204, 188) protected transport packet consisting of 204 bytes which are comprised of one sync byte, 187 data bytes, and 16 redundancy bytes. The following table (Layer 2 Synchronization Values) illustrates the mean acquisition time, mean time to loss of lock, and the probability of false lock during synchronization of the second layer Reed-Solomon/Deinterleaver decoder as a function of the bit error rate of the data steam from the output of the first layer Viterbi decoder for a code word length=204 bytes, sync word length=8 bits, k=0, L=2, and data rate=60 Mbits/sec).

Table of Layer 2 Synchronization Values

| Bit Error Rate | $T_{ac}$ | | $T_{11}$ | | $P_{fl}$ |
|---|---|---|---|---|---|
| | # frames | sec | # frames | sec | |
| 5.0e−04 | 3.88 | 1.05e−04 | 9.00e+15 | 2.44e+11 | 5.98e−08 |
| 1.0e−03 | 3.91 | 1.06e−04 | 9.00e+15 | 2.44e+11 | 5.98e−08 |
| 2.0e−03 | 3.98 | 1.07e−04 | 9.00e+15 | 2.44e+11 | 5.98e−08 |
| 5.0e−03 | 4.16 | 1.12e−04 | 4.50e+15 | 1.22e+11 | 5.98e−08 |
| 1.0e−02 | 4.48 | 1.21e−04 | 6.37e+12 | 1.72e+08 | 5.98e−08 |
| 2.0e−02 | 5.15 | 1.39e−04 | 1.39e+10 | 3.78e+05 | 5.98e−08 |
| 5.0e−02 | 7.23 | 1.98e−04 | 5.21e+06 | 1.41e+02 | 5.98e−08 |

$T_{ac}$ = mean acquisition time;
$T_{11}$ = mean time to loss of lock; and
$P_{fl}$ = probability of false lock.

For an expected BER of 1.0e−03 about 4 frame times will be required to establish synchronization and loss of sync will occur after 9.0e+15 frames. With one modification this basic format has been adopted by the V4/MOD-B task force as a standard for multiprogram TV via satellite. One out of every eight synchronization words in the data stream is mod 2 complemented.

Given a data stream consisting of a sequence of the aforementioned MPEG Protected Transport Packets, the second layer sync stage searches for the predefined sync byte and, upon having met the sync acquisition criteria of FIGS. 5A, 5B or 5C, indicates the second layer in sync condition, thus enabling the Reed-Solomon/Deinterleaver decoder functions. In addition to providing proper sync word alignment for the Reed-Solomon/Deinterleaver decoder, this second layer synchronization logic is able to resolve a 180 degree phase uncertainty that may have been introduced by the system demodulator (not illustrated) of which the first layer (Viterbi) synchronization logic is not able to detect as discussed above. Resolution of the 180 degree phase uncertainty is achieved during the acquisition phase by simultaneously monitoring not only the synchronization word itself, but also its complemented version.

Descrambler Synchronization

Figure 6:
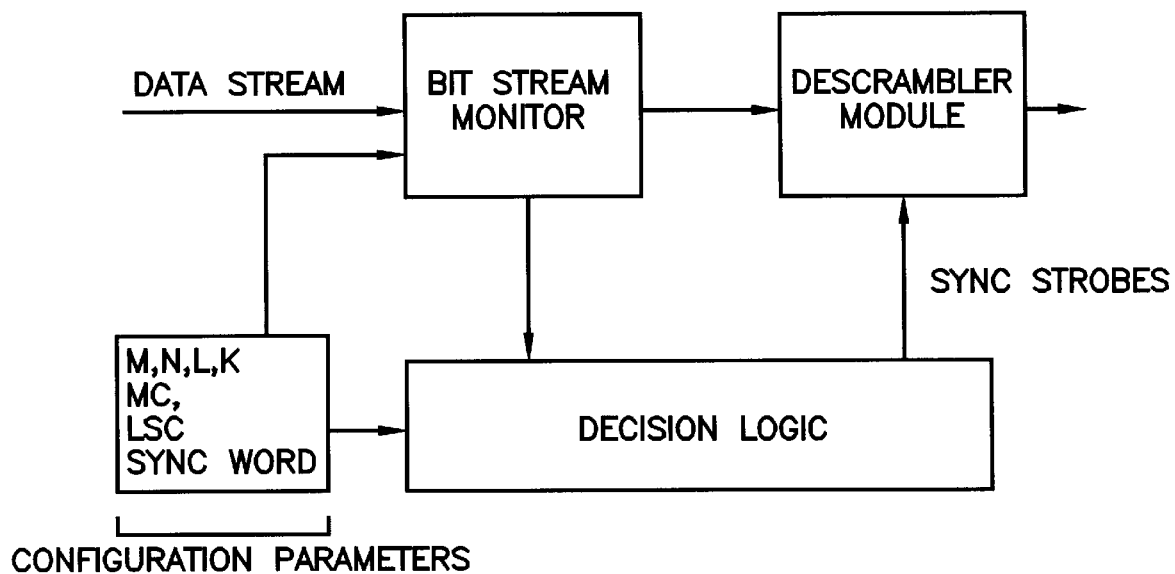
FIG. 6 illustrates a more detailed schematic block diagram of the Descrambler of FIG. 2.

The third layer Descrambler is restarted every 8*N byte times. This restart is aligned with the complemented synchronization word that is present in the data stream once every eight Reed-Solomon code words (once every 8*N bytes). Referring to FIG. 6, a schematic block diagram of the third layer Descrambler is illustrated. The configuration parameters have been previously defined above.

Figure 7:
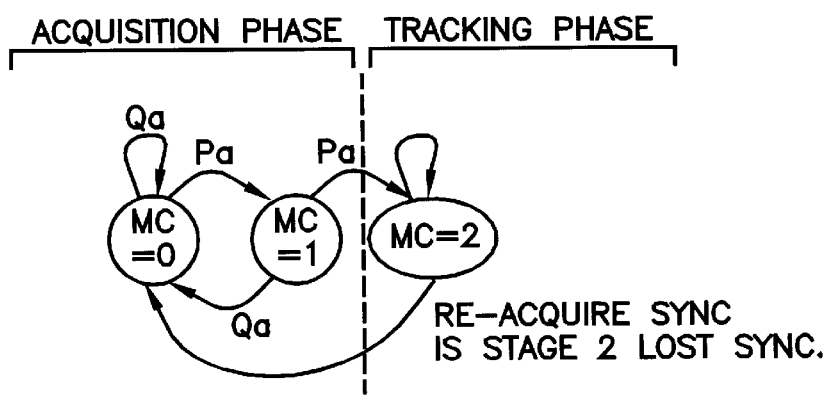
FIG. 7 illustrates a state diagram of the Descrambler of FIG. 6.

Synchronization of the Descrambler is similar to synchronization of the second layer (Reed-Solomon/Deinterleaver) during its acquisition phase as disclosed above. Referring to FIG. 7, a state diagram of the system of FIG. 6 is illustrated. The state diagram of FIG. 7 outlines the mechanisms in determining synchronization, tracking and loss of synchronization of the Descrambler (third layer).

The second layer synchronization looks for sync code words and when finding same, locks onto the code words and subsequent data words. When no data is being sent (long stream of zeros), however, the transmission scrambler generates duplicates of the second layer sync word, for example, 47 Hex. In operation, this increases the probability at the receiving end for the second layer sync stage to false lock, and thus increases the time that the second layer sync stage may be in false lock.

The third layer (Descrambler) synchronization would not be confused by improper creation of duplicates of the original second layer sync word patterns because the correct placement of inverted sync bytes would not occur. Thus, synchronization of the third layer would indicate correct sync alignment of all three layers, but false alignment of the second layer would not produce a correct sequence of inverted bytes every eight words (8*N bytes).

The present invention, upon synchronization of the third layer (Descrambler), can disable the operation of the second layer synchronization state machine logic. This forces the second layer decoder (Reed-Solomon/Deinterleaver) to stay in its last sync position so long as the third layer remains in synchronization (FIG. 7).

Figure 8:
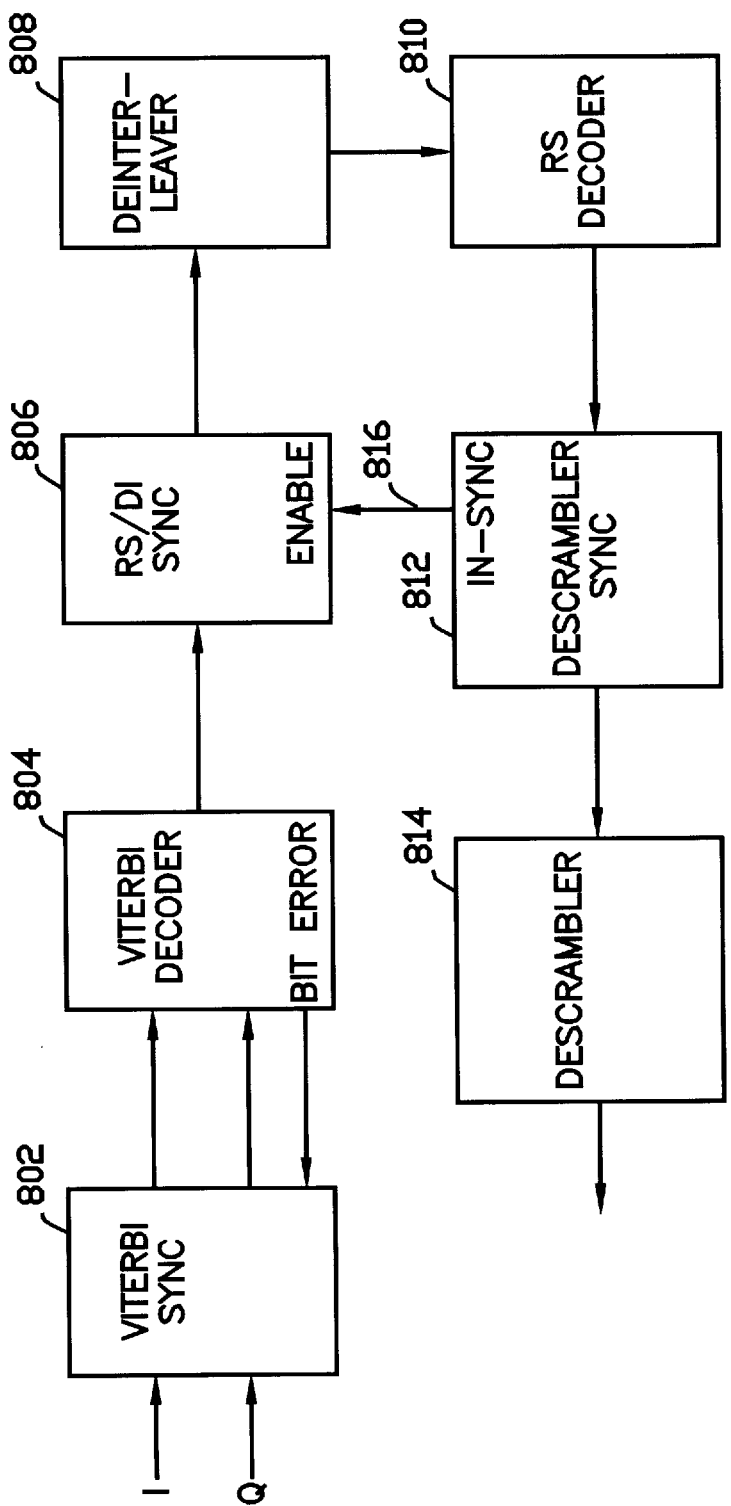
FIG. 8 illustrates a schematic block diagram of a preferred embodiment of the present invention.

Referring now to FIG. 8, a schematic block diagram of a preferred embodiment of the present invention is illustrated. The Viterbi Sync 802 observes the incoming data stream on the I and Q channels for valid data symbols and the bit errors in the decoded data stream from the Viterbi Decoder 804. The Viterbi Sync 802 determines synchronization as disclosed above. Next the Reed-Solomon/Deinterleaver Sync 806 searches the data stream from the Viterbi Decoder 804 for a predefined sync word in order to obtain data stream synchronization for the Deinterleaver 808 and Reed-Solomon Decoder 810.

Figure 1:
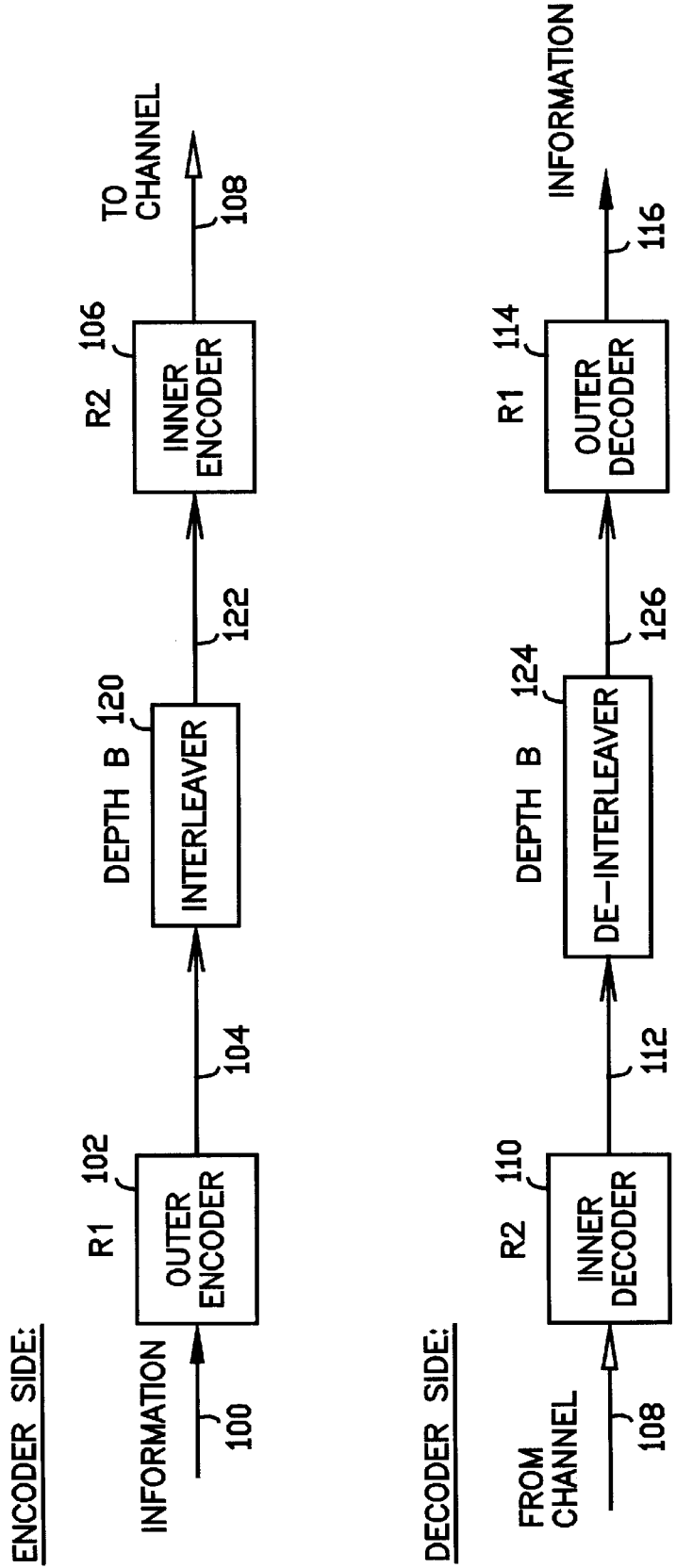
FIG. 1 illustrates a functional block diagram of a basic interleaved concatenated forward error correction technique in a digital data coding and decoding transmission system.

The second layer synchronization suffers from the possibility of false sync lock when no changing data is being sent (long stream of zeros). This is caused when the transmission scrambler (FIG. 1) generates duplicates of the second layer sync word. This may cause the second layer to false lock and remain in a false lock condition for a greater amount of time than would normally be the case under random white noise conditions. The third layer (Descrambler) synchronization would not be confused by a false sync lock condition in the second layer because correct placement of the required inverted sync bytes every eight words (8*N bytes) would not occur.

The present invention utilizes the synchronization status of the third layer (Descrambler) to disable the operation of the second layer synchronization logic. An aspect of the invention allows the second layer synchronization monitoring to be disabled as long as there is correct synchronization in the Descrambler logic (inverted sync bytes every eight words). When synchronization is detected in the Descrambler Sync 812, an in-sync signal 816 is sent to the Reed-Solomon/Deinterleaver Sync 806, effectively disabling the Reed-Solomon/Deinterleaver Sync 806 state machine (FIGS. 5A–5C). This forces the Codec C system to ignore false sync lock at the second layer so long as the Descrambler Sync 812 (third layer) indicates an in-sync condition.

The method and apparatus of the present invention, therefore, is well adapted to carry out the objects and attain the ends and advantages mentioned, as well as others inherent therein. While a presently preferred embodiment of the invention has been given for purposes of disclosure, numerous changes in the details of procedures for accomplishing the desired results, circuits that perform the disclosed functions, and methods of forward error correction decoding will readily suggest themselves to those skilled in the art, and which are encompassed within the spirit of the invention and the scope of the appended claims.

What is claimed is:

1. A method for synchronizing a decoder to a concatenated forward error correction coded digital signal, comprising the steps of:
   receiving a digitally encoded signal having concatenated forward error correction coding;
   synchronizing to a first layer of the concatenated forward error correction coded signal;
   synchronizing to a second layer of the concatenated forward error correction coded signal; and
   synchronizing to a third layer of the concatenated forward error correction coded signal, wherein the step of synchronizing to the second layer is disabled once the third layer is synchronized so that the third layer synchronization determines synchronization of the decoder for both the second and third layers of the forward error correction coded digital signal.

2. The method of claim 1, wherein the step of synchronizing the first layer is performed with a Viterbi synchronizer.

3. The method of claim 1, wherein the step of synchronizing the second layer is performed with a Reed-Solomon synchronizer which identifies a sync word in the output of the first layer of the decoder for determining synchronization of the second layer of the decoder.

4. The method of claim 1, wherein the step of synchronizing the third layer is performed with a Descrambler synchronizer which identifies an inverted sync word in the output of the second layer of the decoder for determining synchronization of the third layer of the decoder.

5. The method of claim 4, wherein the inverted sync word occurs once every 8*N second layer code words.

6. The method of claim 1, further comprising the step of determining when the second layer synchronization is in false lock by observing whether the third layer is in sync.

7. The method of claim 1, further comprising the step of resolving signal phase ambiguity in a demodulated digital signal, wherein said demodulated digital signal is an output of said first layer.

8. The method of claim 7, wherein the step of resolving the signal phase ambiguity is by the second layer synchronization simultaneously monitoring both the sync word and its complement.

9. The method of claim 1, wherein the digital signal is a digital video signal having an MPEG-2 system layer document format.

10. A method for decoding a concatenated forward error correction coded digital video signal, comprising the steps of:
   receiving a digital video signal having concatenated forward error correction coding;
   synchronizing to the received concatenated forward error correction coded digital video signal;
   decoding the digital video signal in a first decoder, the first decoder having a first signal output;
   synchronizing to the first signal from the output of the first decoder;
   deinterleaving the first signal;
   decoding the first signal in a second decoder, the second decoder having a second signal output;
   synchronizing to the second signal from the output of the second decoder;
   decoding the second signal in a third decoder, the third decoder having a third signal output; and
   disabling synchronization of the second signal when the third signal is in synchronization, wherein the third signal determines synchronization for both the second and third decoders.

11. An apparatus for synchronizing a decoder to a concatenated forward error correction coded digital signal, comprising:
   a first synchronizing circuit that synchronizes a first decoder to a first layer of the concatenated forward error correction coded signal;
   a second synchronizing circuit that synchronizes a second decoder to a second layer of the concatenated forward error correction coded signal; and
   a third synchronizing circuit that synchronizes a third decoder to a third layer of the concatenated forward error correction coded signal;

said third synchronizing circuit disabling said second synchronizing circuit when the third layer is synchronized, wherein the third synchronizing circuit determines synchronization for both the second and third decoders.

12. The apparatus of claim 11, wherein said first synchronizing circuit is a Viterbi synchronizer.

13. The apparatus of claim 11, wherein said second synchronizing circuit is a Reed-Solomon synchronizer which identifies a sync word in the output of said first decoder for determining synchronization of said second decoder.

14. The apparatus of claim 11, wherein said third synchronizing circuit is a Descrambler synchronizer which identifies an inverted sync word in the output of said second decoder for determining synchronization of said third decoder.

15. An apparatus for decoding a concatenated forward error correction coded digital video signal, comprising:

a first decoder having a first signal output;

a first synchronizing circuit that synchronizes said first decoder to the concatenated forward error correction coded digital video signal;

a second decoder having a second signal output;

a second synchronizing circuit that synchronizes said second decoder to the first signal from the output of said first decoder;

a third decoder having a third signal output;

a third synchronizing circuit that synchronizes said third decoder to the second signal from the output of said second decoder; and said third synchronizing circuit disabling said second synchronizing circuit when said third decoder is synchronized, wherein the third synchronizing circuit determines synchronization for both of said second and third decoders.

16. The apparatus of claim 15, further comprising a deinterleaving circuit between said second synchronizing circuit and said second decoder.

17. A method for synchronizing a decoder to a concatenated forward error correction coded digital signal, comprising the steps of:

receiving a digitally encoded signal having concatenated forward error correction coding; and synchronizing to a first layer of said concatenated forward error correction coded signal; and synchronizing to a second layer of said concatenated forward error correction coded signal, wherein said synchronizing to said second layer is performed with a Reed-Solomon synchronizer which identifies a sync word in the output of said first layer for determining synchronization of said second layer; and synchronizing to a third layer of said concatenated forward error correction coded signal, wherein said step of synchronizing to said second layer is disabled once said third layer is synchronized so that said third layer synchronization determines synchronization of said decoder for both said second layer and said third layers of said digitally encoded signal.

18. A method for synchronizing a decoder to a concatenated forward error correction coded digital signal, comprising the steps of:

receiving a digitally encoded signal having concatenated forward error correction coding; and synchronizing to a first layer of said concatenated forward error correction coded signal; and synchronizing to a second layer of said concatenated forward error correction coded signal; and synchronizing to a third layer of said concatenated forward error correction coded signal, wherein said synchronizing to said third layer is performed with a Descrambler synchronizer which identifies an inverted sync word in the output of said second layer for determining synchronization of said third layer, and wherein said synchronizing to said second layer is disabled once said third layer is synchronized so that said third layer synchronization determines synchronization of said decoder for both said second layer and said third layers of said digitally encoded signal.

19. The method of claim 18, wherein said inverted sync word occurs once every 8*N second layer code words.

20. The method of claim 17, further comprising the step of resolving signal phase ambiguity in a demodulated digital signal, wherein said demodulated digital signal is an output of said first layer.

21. The method of claim 20, wherein said step of resolving signal phase ambiguity involves said synchronizing to said second layer further comprising simultaneously monitoring both said sync word and its complement.

22. An apparatus for synchronizing a decoder to a concatenated forward error correction coded digital signal, comprising:

a first synchronizing circuit that synchronizes a first decoder to a first layer of said concatenated forward error correction coded digital signal; and a second synchronizing circuit that synchronizes a second decoder to a second layer of said concatenated forward error correction coded digital signal, wherein said second synchronizing circuit is a Reed-Solomon synchronizer which identifies a sync word in an output of said first decoder for determining synchronization of said second decoder; and a third synchronizing circuit that synchronizes a third decoder to a third layer of said concatenated forward error correction coded digital signal;

said third synchronizing circuit disabling said second synchronizing circuit when said third layer is synchronized, wherein said third synchronizing circuit determines synchronization for both said second decoder and said third decoder.

23. An apparatus for synchronizing a decoder to a concatenated forward error correction coded digital signal, comprising:

a first synchronizing circuit that synchronizes a first decoder to a first layer of said concatenated forward error correction coded digital signal; and a second synchronizing circuit that synchronizes a second decoder to a second layer of said concatenated forward error correction coded digital signal; and a third synchronizing circuit that synchronizes a third decoder to a third layer of said concatenated forward error correction coded digital signal, wherein said third synchronizing circuit is a Descrambler synchronizer which identifies an inverted sync word in an output of said second decoder for determining synchronization of said third decoder;

said third synchronizing circuit disabling said second synchronizing circuit when said third layer is synchronized, wherein said third synchronizing circuit determines synchronization for both said second decoder and said third decoder.

* * * * *

UNITED STATES PATENT AND TRADEMARK OFFICE
CERTIFICATE OF CORRECTION

PATENT NO. : 5,835,165

DATED : November 10, 1998

INVENTOR(S) : Christopher Keate and Nadav Ben-Efraim

It is certified that error appears in the above-identified patent and that said Letters Patent is hereby corrected as shown below:

In the Title:

On the title page, item [54] and Column 1,
Please insert --OF-- after "LOCKING".

Signed and Sealed this

Thirtieth Day of March, 1999

Attest:

Q. TODD DICKINSON

*Attesting Officer*   Acting Commissioner of Patents and Trademarks